United States Patent
Xiao et al.

(10) Patent No.: US 8,093,114 B2
(45) Date of Patent: Jan. 10, 2012

(54) METHOD FOR MAKING SPLIT DUAL GATE FIELD EFFECT TRANSISTOR

(75) Inventors: Deyuan Xiao, Shanghai (CN); Gary Chen, Boise, ID (US); Tan Leong Seng, Shanghai (CN); Roger Lee, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 21 days.

(21) Appl. No.: 12/549,192

(22) Filed: Aug. 27, 2009
(Under 37 CFR 1.47)

(65) Prior Publication Data
US 2010/0087040 A1    Apr. 8, 2010

Related U.S. Application Data

(62) Division of application No. 11/377,236, filed on Mar. 15, 2006, now Pat. No. 7,582,517.

(30) Foreign Application Priority Data
Feb. 6, 2006    (CN) .......................... 2006 1 0023749

(51) Int. Cl.
H01L 29/72         (2006.01)
(52) U.S. Cl. ......... 438/176; 438/283; 438/306; 438/527
(58) Field of Classification Search ................. 438/176, 438/283, 306, 527
See application file for complete search history.

(56) References Cited

U.S. PATENT DOCUMENTS

| 4,047,199 | A  | 9/1977  | Kataoka et al. |
| 4,063,273 | A  | 12/1977 | Mueller |
| 5,442,209 | A  | 8/1995  | Chung |
| 5,691,215 | A  | 11/1997 | Dai et al. |
| 5,751,033 | A  | 5/1998  | Miya |
| 5,828,079 | A  | 10/1998 | Mizuno et al. |
| 5,885,887 | A  | 3/1999  | Hause et al. |
| 5,923,067 | A  | 7/1999  | Voldman |
| 6,157,062 | A  | 12/2000 | Vasanth et al. |
| 6,548,870 | B1 | 4/2003  | Lee |

(Continued)

FOREIGN PATENT DOCUMENTS
CN          2038669 U       5/1989
(Continued)

OTHER PUBLICATIONS

Iniguez, et al., "Modeling and Simulation of Single- and Multiple-gate 2D MESFETs," 1999, IEEE Transactions on Electron Devices, vol. 46, No. 8, pp. 1742-1748.

(Continued)

Primary Examiner — Edward Wojciechowicz
(74) Attorney, Agent, or Firm — Kilpatrick Townsend and Stockton LLP

(57) ABSTRACT

A method for making a semiconductor device with at least two gate regions. The method includes providing a substrate region including a surface. Additionally, the method includes forming a source region in the substrate region by at least implanting a first plurality of ions into the substrate region and forming a drain region in the substrate region by at least implanting a second plurality of ions into the substrate region. The drain region and the source region are separate from each other. Moreover, the method includes depositing a gate layer on the surface and forming a first gate region and a second gate region on the surface.

3 Claims, 15 Drawing Sheets

U.S. PATENT DOCUMENTS

| | | | |
|---|---|---|---|
| 6,689,650 | B2 | 2/2004 | Gambino et al. |
| 6,714,456 | B1 | 3/2004 | Ogura et al. |
| 7,045,849 | B2 | 5/2006 | Chen et al. |
| 7,199,434 | B2 | 4/2007 | Li et al. |
| 7,279,740 | B2 | 10/2007 | Bhattacharyya et al. |
| 7,582,517 | B2 | 9/2009 | Xiao et al. |
| 2002/0127763 | A1 | 9/2002 | Arafa et al. |
| 2004/0161919 | A1 | 8/2004 | Cha et al. |
| 2005/0272256 | A1 | 12/2005 | Wang |
| 2006/0008964 | A1* | 1/2006 | Mineji ............ 438/199 |
| 2006/0154424 | A1* | 7/2006 | Yang et al. ......... 438/283 |
| 2006/0270239 | A1 | 11/2006 | Triyoso |
| 2006/0279332 | A1 | 12/2006 | Wich |
| 2007/0020900 | A1 | 1/2007 | Jain |

FOREIGN PATENT DOCUMENTS

CN         1198008 A      11/1998

OTHER PUBLICATIONS

Final Office Action for U.S. Appl. No. 11/377,936, mailed on Oct. 5, 2009, 24 pages.

Non-Final Office Action for U.S. Appl. No. 11/377,936, mailed on Feb. 23, 2009, 16 pages.

Final Office Action for U.S. Appl. No. 11/377,936, mailed on Aug. 21, 2008, 14 pages.

Non-Final Office Action for U.S. Appl. No. 11/377,936, mailed on Mar. 31, 2008, 12 pages.

Non-Final Office Action for U.S. Appl. No. 11/377,936, mailed on Sep. 21, 2007, 17 pages.

Peatman, et al., "Two-dimensional Metal-semiconductor Field Effect Transistor for Ultra Low Power Circuit Applications," 1994, IEEE Electron Device Letters, vol. 15, No. 7, pp. 245-247.

Final Office Action for U.S. Appl. No. 11/377,936, mailed on Mar. 30, 2011, 22 pages.

Non-Final Office Action for U.S. Appl. No. 11/377,936, mailed on Sep. 30, 2010, 17 pages.

Office Action of Chinese Application No. 200610023748.9, dated Jan. 29, 2010, 8 pages total (English translation not included).

Notice of Allowance for U.S. Appl. No. 11/377,236, mailed on Apr. 27, 2009, 8 pages.

Non-Final Office Action for U.S. Appl. No. 11/377,236, mailed on Dec. 24, 2008, 4 pages.

Non-Final Office Action for U.S. Appl. No. 11/377,236, mailed on Apr. 24, 2008, 11 pages.

Requirement for Restriction/Election for U.S. Appl. No. 11/377,236, mailed on Feb. 25, 2008, 5 pages.

Non-Final Office Action for U.S. Appl. No. 11/377,936, mailed on Aug. 15, 2011, 28 pages.

* cited by examiner

3300

| Process Step Sequence Number | PROCESS STEP DESCRIPTION |
|---|---|
| 1 | WAFER START |
| 2 | WAFER MARK |
| 3 | WAFER SCRUBBER |
| 4 | OXIDE REMOVE |
| 5 | ACTIVE AREA OXIDE PRECLN |
| 6 | ACTIVE AREA PAD OXIDE |
| 7 | ACTIVE AREA NITRIDE |
| 8 | ACTIVE AREA NITRIDE DEPOSITION SCRUB |
| 9 | ACTIVE AREA SION DEPOSITION |
| 10 | ACTIVE AREA SION DEPOSITION SCRUB |
| 11 | ACTIVE AREA PHOTO(DUV) |
| 12 | ACTIVE AREA CD-PHOTO |
| 13 | ACTIVE AREA ETCH |
| 14 | ACTIVE AREA ASHER |
| 15 | ACTIVE AREA ETCH POLYMER & WET STRIP |
| 16 | ACTIVE AREA POST ETCH SC1 CLEAN |
| 17 | ACTIVE AREA CD-ETCH |
| 18 | ACTIVE AREA ETCH LEICA SEM REVIEW |
| 19 | STI PAD OXIDE PRECLN |
| 20 | STI LINING OXIDE |
| 21 | STI HDP OXIDE DEPOSITION |
| 22 | RTA PRECLN |
| 23 | STI RTA |
| 24 | REVERSE TONE PHOTO |
| 25 | REVERSE TONE OVERLAY |
| 26 | REVERSE TONE ETCH |
| 27 | REVERSE TONE ASHER |
| 28 | REVERSE TONE WET STRIP |
| 29 | STI CMP |
| 30 | ACTIVE AREA NITRIDE STRIP |
| 31 | STI PAD OXIDE Remove |
| 32 | SACRIFICE OXIDE PRECLN |
| 33 | SACRIFICE OXIDE |
| 34 | PWELL PHOTO |
| 35 | PWELL OVERLAY |
| 36 | PWELL IMPLANT |
| 37 | NCHANNEL IMPLANT |
| 38 | VTN IMPLANT |
| 39 | PWELL ASHER |
| 40 | PWELL WET STRIP |
| 41 | NWELL PHOTO |
| 42 | NWELL OVERLAY |
| 43 | NWELL IMPLANT |
| 44 | PCHANNEL IMPLANT |
| 45 | VTP IMPLANT |
| 46 | NWELL ASHER |
| 47 | NWELL WET STRIP |
| 48 | NWELL ANNEA PRECLN |
| 49 | NWLL ANNEAL |
| 50 | SACRIFICE OXIDE REMOVE |
| 51 | GATE OXIDE PRECLN |
| 52 | GATE OXIDE |
| 53 | POLY DEPOSITION |
| 54 | POLY DEPOSITION SCRUB |
| 55 | SION COATING |
| 56 | SION SCRUB |
| 57 | GATE PHOTO |
| 58 | GATE OVERLAY |
| 59 | GATE CD-PHOTO |
| 60 | HARD BAKE |
| 61 | POLY ARC ETCH |
| 62 | POLY HARD MASK CD-ETCH |
| 63 | POLY ETCH |
| 64 | GATE ASHER |
| 65 | GATE WET STRIP |
| 66 | POLY ETCH LEICA SEM REVIEW |
| 67 | GATE CD-ETCH |
| 68 | SION REMOVE |
| 69 | GATE RE-OXIDE PRECLN |
| 70 | GATE REOXIDEIDATION |
| 71 | NLDD PHOTO |
| 72 | NLDD OVERLAY |
| 73 | NLDD CD-PHOTO |
| 74 | NPOCKET IMPLANT |
| 75 | NLDD IMPLANT |
| 76 | NLDD ASHER |
| 77 | NLDD WET STRIP |
| 78 | PLDD PHOTO |
| 79 | PLDD OVERLAY |
| 80 | PLDD CD-PHOTO |
| 81 | PPOCKET IMPLANT |
| 82 | PLDD IMPLANT |
| 83 | PLDD ASHER |
| 84 | PLDD WET STRIP |
| 85 | TEOS DEPOSITION PRECLN |
| 86 | LINING TEOS |
| 87 | SIN SPACER |
| 88 | COMPOSITE TEOS SPACER |
| 89 | SPACER ETCH |

| | | | | |
|---|---|---|---|---|
| 90 | SPACER POST CLN | | 131 | SALICIDE SELECTIVE CO/TIN REMOVE |
| 91 | SPACER ETCH LEICA SEM REVIEW | | 132 | SALICIDE RTA2 COSI |
| 92 | OXIDE STRIP | | 133 | SALICIDE RTA LEICA SEM REVIEW |
| 93 | N+ PHOTO | | 134 | SION COATING |
| 94 | N+ OVERLAY | | 135 | SION Scrubber |
| 95 | N+ CD-PHOTO | | 136 | ILD BPTEOS |
| 96 | N+ IMPLANT1 | | 137 | ILD BPTEOS REFLOW |
| 97 | N+ IMPLANT2 | | 138 | CR CLEAN |
| 98 | N+ ASHER | | 139 | PETEOS DEPOSITION |
| 99 | N+ WET STRIP | | 140 | ILD CMP |
| 100 | N+ SC1 | | 141 | ILD CR CLN |
| 101 | N+ RTA ANNEAL | | 142 | SION DEPOSITION |
| 102 | P+ PHOTO | | 143 | WAFER SCRUBBER |
| 103 | P+ OVERLAY | | 144 | CONTACT DUV PHOTO |
| 104 | P+ CD-PHOTO | | 145 | CONTACT OVERLAY |
| 105 | P+ IMPLANT1 | | 146 | CONTACT OVERLAY (To Poly) |
| 106 | P+ IMPLANT2 | | 147 | CONTACT CD-PHOTO |
| 107 | P+ ASHER | | 148 | CONTACT ETCH |
| 108 | P+ WET STRIP | | 149 | CONTACT ASHER |
| 109 | P+ SC1 | | 150 | CONTACT WET STRIP |
| 110 | SPLIT GATE PHOTO | | 151 | CONTACT TI/TIN |
| 111 | SPLIT GATE OVERLAY | | 152 | CONTACT TI ANNEAL |
| 112 | SPLIT GATE PHOTO CD | | 153 | CONTACT SPUT LEICA SEM REVIEW |
| 113 | HARD BAKE | | 154 | CONTACT W DEPOSITION (3300+-330A) |
| 114 | SPLIT GATE ETCH | | 155 | CONTACT W CMP |
| 115 | SPLIT GATE ETCH CD | | 156 | MET1 DEPOSITION |
| 116 | SPLIT GATE ASHER | | 157 | SCRUB CLEAN AFTER AlCu/TiN DEPOSITION |
| 117 | SPLIT GATE WET STRIP | | 158 | SION DEPOSITION |
| 118 | SALICIDE BLOCK CAP OXIDE PRE CLN | | 159 | SCRUB CLEAN AFTER SION DEPOSITION |
| 119 | SALICIDE BLOCK CAP OXIDE | | 160 | METAL1 PHOTO |
| 120 | P+ RTA | | 161 | METAL1 OVERLAY |
| 121 | SALICIDE BLOCK PHOTO | | 162 | METAL1 CD-PHOTO |
| 122 | SALICIDE BLOCK OVERLAY | | 163 | HARD BAKE |
| 123 | SALICIDE BLOCK DRY ETCH | | 164 | METAL1 ETCH WITH ARC |
| 124 | SALICIDE BLOCK WET ETCH | | 165 | METAL1 WET STRIP |
| 125 | ASHER | | 166 | METAL1 CD-ETCH |
| 126 | PR STRIP | | 167 | METAL1 ETCH LEICA SEM REVIEW |
| 127 | SALICIDE BLOCK WET STRIP +SC1 | | 168 | PURE H2 ALLOY |
| 128 | SALICIDE PRE-OXIDE REMOVE | | | |
| 129 | SALICIDE CO DEPOSITION (CO75A+TiN200A) | | | |
| 130 | SALICIDE RTA1 COSI | | | |

METHOD FOR MAKING SPLIT DUAL GATE FIELD EFFECT TRANSISTOR

CROSS-REFERENCES TO RELATED APPLICATIONS

This application is a divisional application and claims priority to U.S. patent application Ser. No 11,377,236, now U.S. Pat. No. 7,582,517, which will issue on Sep. 1, 2009, which claims priority to Chinese Patent Application No. 200610023749.3, filed Feb. 6, 2006, commonly assigned and incorporated by reference herein for all purposes.

The following two commonly-owned co-pending applications, including this one, are being filed concurrently and the other one is hereby incorporated by reference in its entirety for all purposes:

1. U.S. patent application Ser. No. 11/377,936, in the name of Deyuan Xiao, Gary Chen, Tan Leong Seng, and Roger Lee, titled, "Split Dual Gate Field Effect Transistor,"; and 2. U.S. patent application Ser. No. 11/377,236, in the name of Deyuan Xiao, Gary Chen, Tan Leong Seng, and Roger Lee, titled, "Method for Making Split Dual Gate Field Effect Transistor,".

STATEMENT AS TO RIGHTS TO INVENTIONS MADE UNDER FEDERALLY SPONSORED RESEARCH OR DEVELOPMENT

Not applicable

REFERENCE TO A "SEQUENCE LISTING," A TABLE, OR A COMPUTER PROGRAM LISTING APPENDIX SUBMITTED ON A COMPACT DISK

Not applicable

BACKGROUND OF THE INVENTION

The present invention is directed to integrated circuits. More particularly, the invention provides a method for making a split dual gate field effect transistor. Merely by way of example, the invention has been applied to a logic system. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as a given process, device layout, and/or system design often work down to only a certain feature size.

An example of such a limit is how to reduce the transistor leakage current and improve the transistor drive current. For example, reducing the source-drain voltage of a transistor can lower the active power, but doing so often reduces the transistor drive current. The transistor drive current can be improved by reducing the threshold voltage and thinning the gate dielectric, but such actions often raise the transistor leakage current.

From the above, it is seen that an improved method for making a transistor structure is desired.

BRIEF SUMMARY OF THE INVENTION

The present invention is directed to integrated circuits. More particularly, the invention provides a method for making a split dual gate field effect transistor. Merely by way of example, the invention has been applied to a logic system. But it would be recognized that the invention has a much broader range of applicability.

In a specific embodiment, the invention provides a method for making a semiconductor device with at least two gate regions. The method includes providing a substrate region including a surface. Additionally, the method includes forming a source region in the substrate region by at least implanting a first plurality of ions into the substrate region and forming a drain region in the substrate region by at least implanting a second plurality of ions into the substrate region. The drain region and the source region are separate from each other. Moreover, the method includes depositing a gate layer on the surface and forming a first gate region and a second gate region on the surface. The forming a first gate region and a second gate region includes forming an insulation region on the surface by at least removing a part of the gate layer, and the first gate region and the second gate region are separated by the insulation region. The first gate region is capable of forming a first channel in the substrate region, and the first channel is from the source region to the drain region. The second gate region is capable of forming a second channel in the substrate region, and the second channel is from the source region to the drain region.

According to another embodiment of the present invention, a method for making a semiconductor device with at least two gate regions includes providing a substrate region including a surface. Additionally, the method includes forming a source region in the substrate region by at least implanting a first plurality of ions into the substrate region, and forming a drain region in the substrate region by at least implanting a second plurality of ions into the substrate region. The drain region and the source region are separate from each other. Moreover, the method includes depositing a gate layer on the surface and forming a first spacer region. The first spacer region is in contact with the gate layer. Also, the method includes forming a second spacer region, and the second spacer region is in contact with the gate layer. Additionally, the method includes removing at least a part of the gate layer to form a first gate region, a second gate region, and an insulation region on the surface. The first gate region and the second gate region are separated by the insulation region.

According to yet another embodiment of the present invention, a method for making a semiconductor device with at least two gate regions includes providing a substrate region including a surface. Additionally, the method includes forming a source region in the substrate region by at least implanting a first plurality of ions into the substrate region, and forming a drain region in the substrate region by at least implanting a second plurality of ions into the substrate region. The drain region and the source region are separate from each other. Moreover, the method includes depositing a gate layer on the surface, and forming a first spacer region. The first spacer region is in contact with the gate layer. Also, the method includes forming a second spacer region, and the second spacer region is in contact with the gate layer. Additionally, the method includes removing at least a part of the gate layer to form a first gate region, a second gate region, and an insulation region on the surface. The first gate region and the second gate region are separated by the insulation region. The first gate region is associated with a first channel related to a first channel length, and the first channel length is equal to or shorter than 200 nm. The insulation region is associated with a width in a direction from the first gate region to the second gate region, and the width ranges from 10 nm to 10,000 nm.

Many benefits are achieved by way of the present invention over conventional techniques. Some embodiments of the present invention provide a new method for making a new planar split dual gate transistor device. Certain embodiments of the present invention provide a method for making dual gates that can be biased independently. For example, the independent gate biases can provide dynamical control of the device characteristics such as threshold voltage, sub-threshold swing, and/or the saturation drain current. Some embodiments of the present invention can be used to make a device that significantly reduces transistor leakage current. Certain embodiments of the present invention provide a method for making a device that has adjustable threshold voltage without varying gate oxide thickness or doping profile.

Various additional objects, features and advantages of the present invention can be more fully appreciated with reference to the detailed description and accompanying drawings that follow.

BRIEF DESCRIPTION OF THE DRAWINGS

FIGS. 13(A) and (B) show a simplified method for making split dual gate field effect transistor according to another embodiment of the present invention;

DETAILED DESCRIPTION OF THE INVENTION

The present invention is directed to integrated circuits. More particularly, the invention provides a method for making a split dual gate field effect transistor. Merely by way of example, the invention has been applied to a logic system. But it would be recognized that the invention has a much broader range of applicability.

Figure 1:
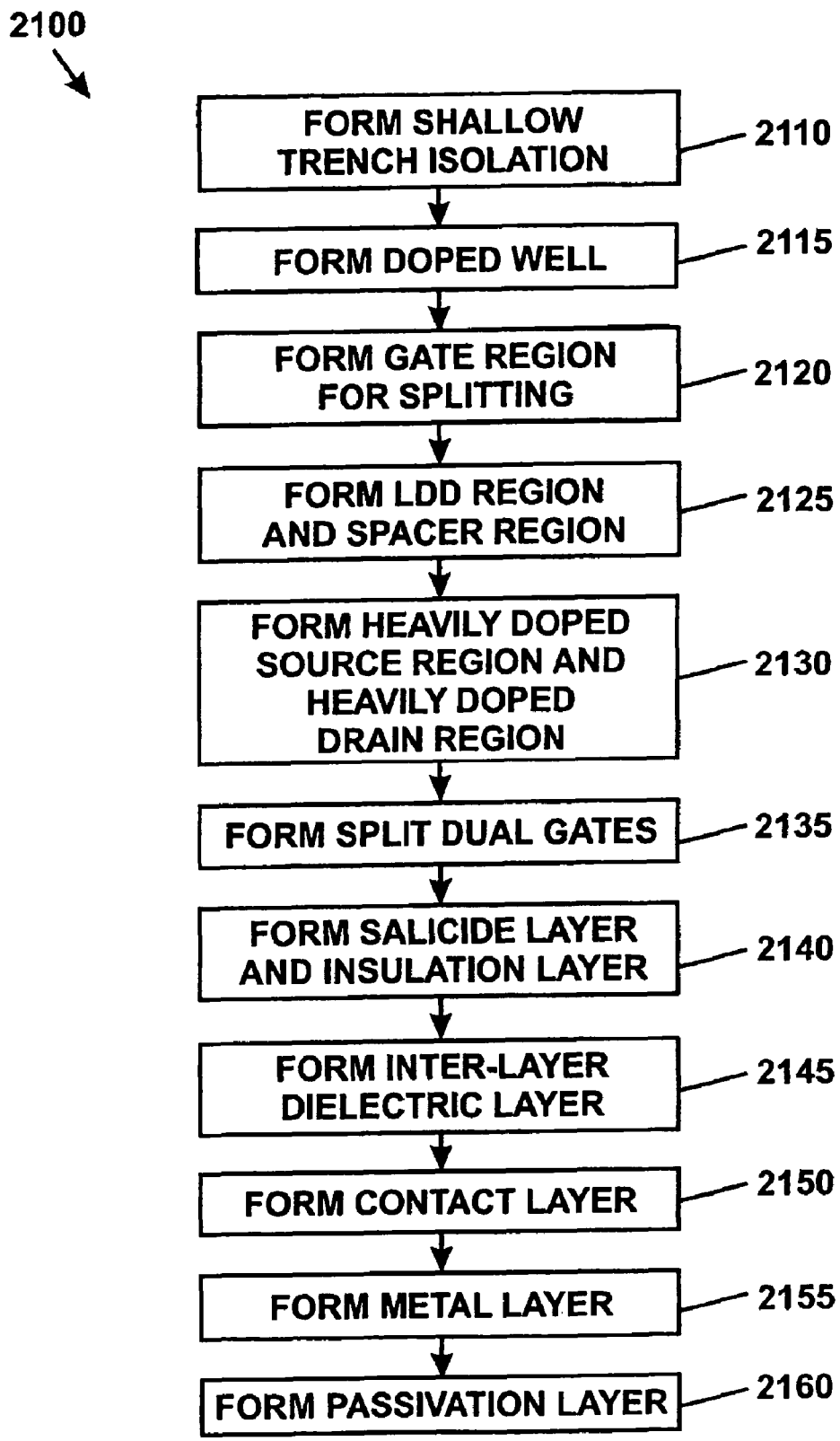
FIG. 1 is a simplified method for making split dual gate field effect transistor according to an embodiment of the present invention.

FIG. 1 is a simplified method for making split dual gate field effect transistor according to an embodiment of the present invention. This diagram is merely an example, which should not unduly limit the scope of the claims herein. The method 2100 includes the following processes:

1. Process 2110 for forming shallow trench isolation;
2. Process 2115 for forming doped well;
3. Process 2120 for forming gate region for splitting;
4. Process 2125 for forming LDD region and spacer region;
5. Process 2130 for forming heavily doped source region and heavily doped drain region;
6. Process 2135 for forming split dual gates;
7. Process 2140 for forming salicide layer and insulation layer;
8. Process 2145 for forming inter-layer dielectric layer;
9. Process 2150 for forming contact layer;
10. Process 2155 for forming metal layer;
11. Process 2160 for forming passivation layer.

The above sequence of processes provides a method according to an embodiment of the present invention. Other alternatives can also be provided where processes are added, one or more processes are removed, or one or more processes are provided in a different sequence without departing from the scope of the claims herein. Future details of the present invention can be found throughout the present specification and more particularly below.

Figure 2A:
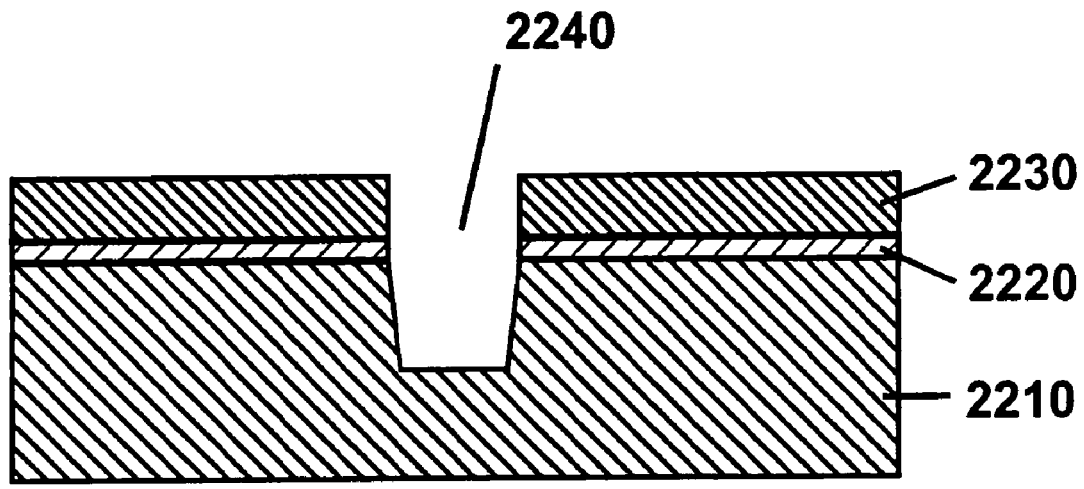
FIGS. 2(A) and (B) show a simplified method for forming shall trench isolation for making split dual gate field effect transistor according to an embodiment of the present invention.
Figure 2B:
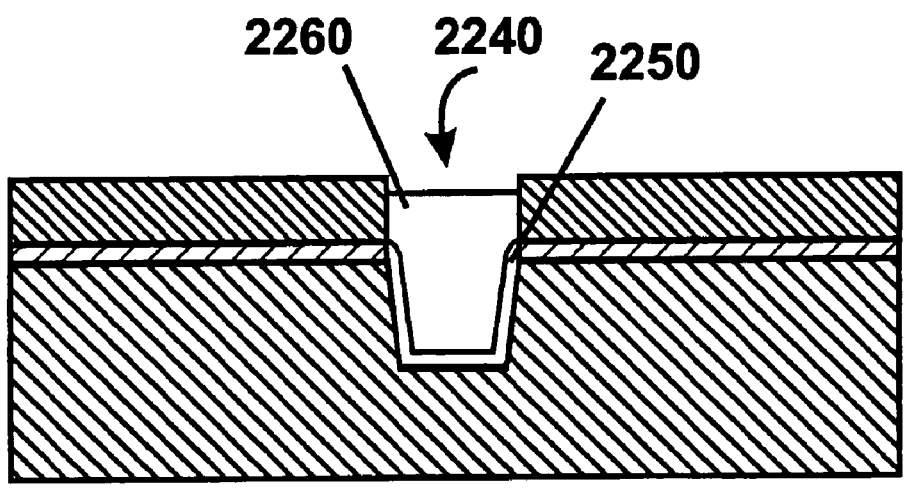

At the process 2110, one or more shallow trench isolations are formed. FIGS. 2(A) and (B) show a simplified method for forming shall trench isolation for making split dual gate field effect transistor according to an embodiment of the present invention. These diagrams are merely examples, which should not unduly limit the scope of the claims. One of ordinary skill in the art would recognize many variations, alternatives, and modifications.

As shown in FIGS. 2(A) and (B), a starting semiconductor wafer 2210 is provided. For example, the starting wafer 2210 includes silicon. In another example, the starting wafer 2210 includes a substrate region. On the starting wafer 2210, a silicon oxide layer 2220, a silicon nitride layer 2230, and a silicon oxynitride layer are formed sequentially. Additionally, a trench 2240 is formed by etching part of the silicon oxynitride layer, the silicon nitride layer 2230, the silicon oxide layer 2220, and the starting wafer 2210. The bottom surface and side surfaces of the trench 2240 are covered by an oxide layer 2250. Afterwards, the trench is filled by an oxide material 2260. For example, the oxide material 2260 includes HDP CVD oxide.

In one embodiment, the following processes are performed:
Wafer Start (P-type, 8-12 ohm-cm)
AA OXIDE DEPOSITION (Pad oxide 110 Å/920° C., 45 minutes dry $O_2$)
AA Nitride DEPOSITION 1625 Å (780° C., 10-40 Pa, $SiH_2Cl_2/NH_3$)
SiON DARC DEPOSITION 320 Å (DARC, 320 Å, helium based)
AA PHOTO/DUV (0.23±0.023 μm)
AA ETCH (0.22±0.025 μm)
(SiN/OXIDE etch chamber-1, Si etch chamber-2, 3500 Å, 80 degrees)
STI Liner OXIDE 200 Å (1000° C., dry $O_2$)
STI HDP (HDP STI5800, 5.8 KÅ)
STI CMP (4100±500 Å, Polish 2.5 KÅ/DIW-HF clean)

Figure 3:
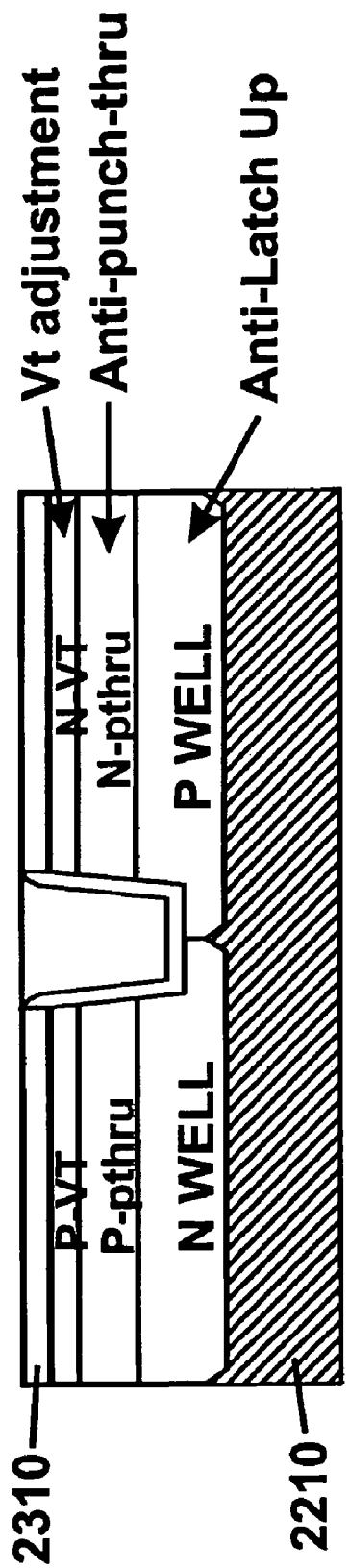
FIG. 3 shows a simplified method for forming doped well for making split dual gate field effect transistor according to an embodiment of the present invention.

At the process 2115, one or more doped wells are formed. FIG. 3 shows a simplified method for forming doped well for making split dual gate field effect transistor according to an embodiment of the present invention. This diagram is merely an example, which should not unduly limit the scope of the claims. One of ordinary skill in the art would recognize many variations, alternatives, and modifications.

As shown in FIG. 3, the silicon oxynitride layer, the silicon nitride layer 2230, and the silicon oxide layer 2220 are removed from the wafer 2210. On the wafer 2210, another oxide layer 2310 is formed. Afterwards, in one example, an n-well is formed in the wafer 2210. Additionally, an antipunch-through ion implantation is performed with p-type dopants, and a threshold-adjustment ion implantation is performed also with p-type dopants. In another example, a p-well is formed in the wafer 2210. Additionally, an anti-punchthrough ion implantation is performed with n-type dopants, and a threshold-adjustment ion implantation is performed also with n-type dopants.

In one embodiment, the following processes are performed:
AA Nitride Removal (50:1 HF 60 seconds and 175° C. $H_3PO_4$ 60 minutes)
Measure remain oxide thickness<120 Å/Pad oxide Removal (50:1 HF 2.5 minutes, E/R=55 Å/minute)
SACRIFICE OXIDE DEPOSITION (Dry 110 Å, 920° C., 45 minutes, $O_2$)

For example, the following additional processes are performed for NMOS transistor:
P-Well Photo (PW/AA overlay±0.1 μm)
P-Well Implant: P-well B11 (specie $B^+$, energy 160 KeV, dosage $1.5 \times 10^{13}$ ions/cm$^2$, tilt 0)
N-APT Implant: N-APT B11 (specie $B^+$, energy 25 KeV, dosage $5.5 \times 10^{12}$ ions/cm$^2$, tilt 0)
VTN Implant: VT IMP In115 (specie $In^+$, energy 170 KeV, dosage $7.0 \times 10^{12}$ ions/cm$^2$, tilt 0)

In another example, the following additional processes are performed for PMOS transistor:
N-Well Photo (NW/OD overlay±0.1 μm)
N-well Implant: N-well P31 (specie $P^+$, energy 440 KeV, dosage $1.5 \times 10^{13}$ ions/cm$^2$, tilt 0)
P-APT Implant: P-APT P31 (specie $P^+$, energy 140 KeV, dosage $1.5 \times 10^{12}$ ions/cm$^2$, tilt 0)
VTP Implant: VTP A75 (specie $As^+$, energy 130 KeV, dosage $1.1 \times 10^{13}$ ions/cm$^2$, tilt 0)

Figure 4A:
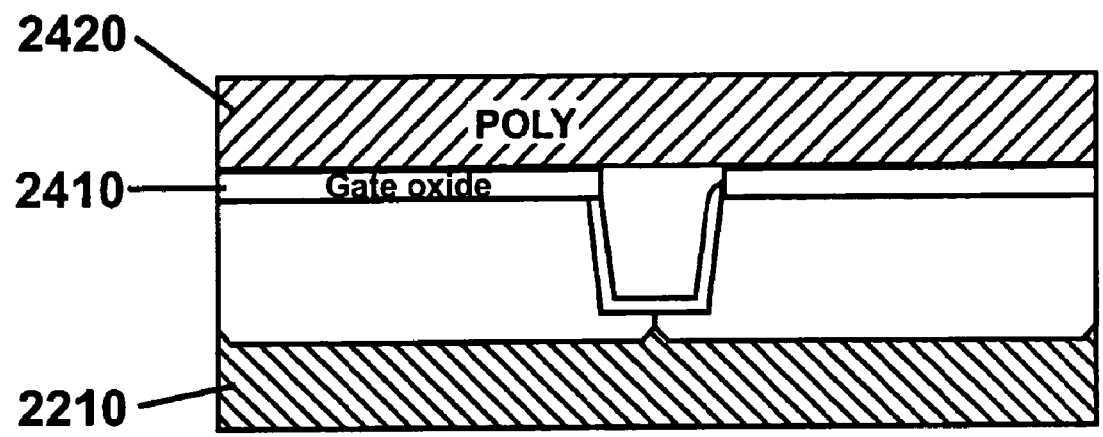
FIGS. 4(A) and (B) show a simplified method for forming gate region for splitting for making split dual gate field effect transistor according to an embodiment of the present invention.
Figure 4B:
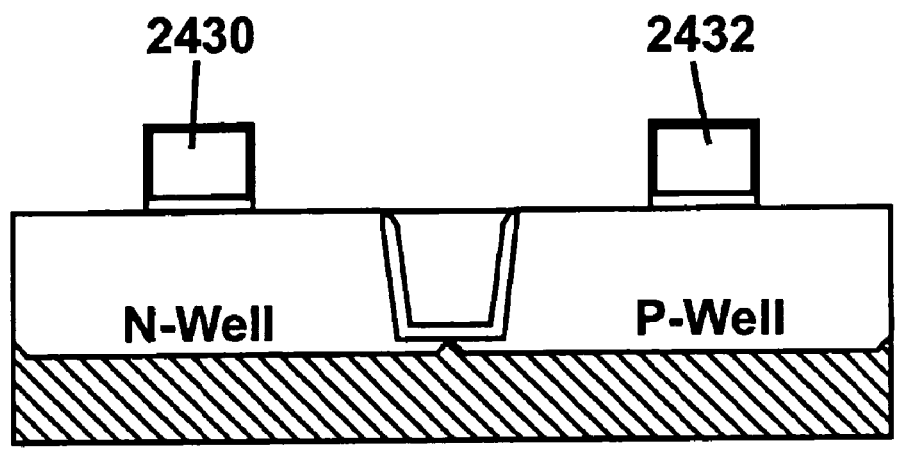

At the process 2120, one or more gate regions are formed for splitting. FIGS. 4(A) and (B) show a simplified method for forming gate region for splitting for making split dual gate field effect transistor according to an embodiment of the present invention. These diagrams are merely examples, which should not unduly limit the scope of the claims. One of ordinary skill in the art would recognize many variations, alternatives, and modifications.

As shown in FIGS. 4(A) and (B), the oxide layer 2310 is removed, and another oxide layer 2410 is deposited on the wafer 2210. On the oxide layer 2410, a polysilicon layer 2420 is formed. Afterwards, the polysilicon layer 2420 is partially etched to form polysilicon gate regions 2430 and 2432. The polysilicon gate regions 2430 and 2432 are then partially oxidized under certain conditions.

In one embodiment, the following processes are performed:
SAC Oxide Removal
Gate Oxide Deposition (750° C., Wet $O_2$; 900° C. anneal; 32±2 Å)
POLY Deposition (620° C. 2000 Å, Undoped poly/crystallized flat poly)
DARC DEPOSITION (DARC, 320 Å, He based)
POLY PHOTO (DUV scanner, 0.18±0.015 μm; Overlay (Poly Gate/AA=±0.07 μm))
Poly Gate Etch: 1. Hard bake; 2. Poly etch; 3. polymer dip (100:1 HF 10 seconds); 4. PR strip; 5. AEI/CD (0.18±0.015 μm); 6. Oxide thickness measure (Trench OXIDE 3550±600 Å, Oxide on Active Area>10 Å); 7. SiON mask remove (50:1 HF 5 seconds, and $H_3PO_4$ 7 minutes)
Poly Re_Oxidation (1000° C., RTO 20±4 Å for etch damage recovery).

Figure 5:
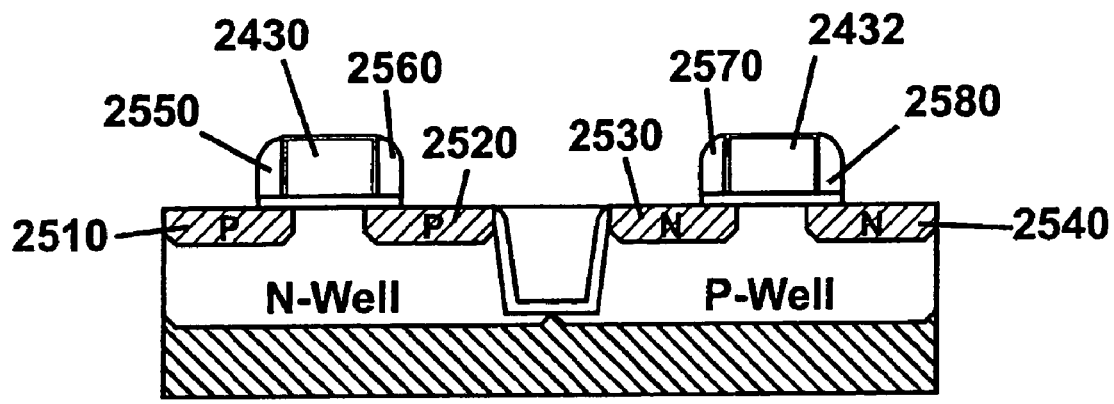
FIG. 5 shows a simplified method for forming LDD region and spacer region for making split dual gate field effect transistor according to an embodiment of the present invention.

At the process 2125, one or more LDD regions and one or more spacer regions are formed. FIG. 5 shows a simplified method for forming LDD region and spacer region for making split dual gate field effect transistor according to an embodiment of the present invention. This diagram is merely an example, which should not unduly limit the scope of the claims. One of ordinary skill in the art would recognize many variations, alternatives, and modifications.

As shown in FIG. 5, one or more ion implantation processes are performed to form one or more LDD regions. For example, the LDD regions 2510 and 2520 are p-type doped for PMOS. In another example, the LDD regions 2530 and 2540 are n-type doped for NMOS. Additionally, one or more spacers are formed. For example, each of the spacers 2550, 2560, 2570, and 2580 includes a nitride layer sandwiched between two oxide layers.

In one embodiment, the following processes are performed:
NLL PHOTO (e.g., 1.8V device) (In-line monitor OVERLAY/CD)
PLL PHOTO (e.g., 1.8V device) (In-line monitor OVERLAY/CD)
ONO Spacer DEPOSITION (In-line monitor ONO THICKNESS)
Spacer ETCH (In-line monitor remaining OXIDE THICKNESS and STI OXIDE THICKNESS)

Figure 6:
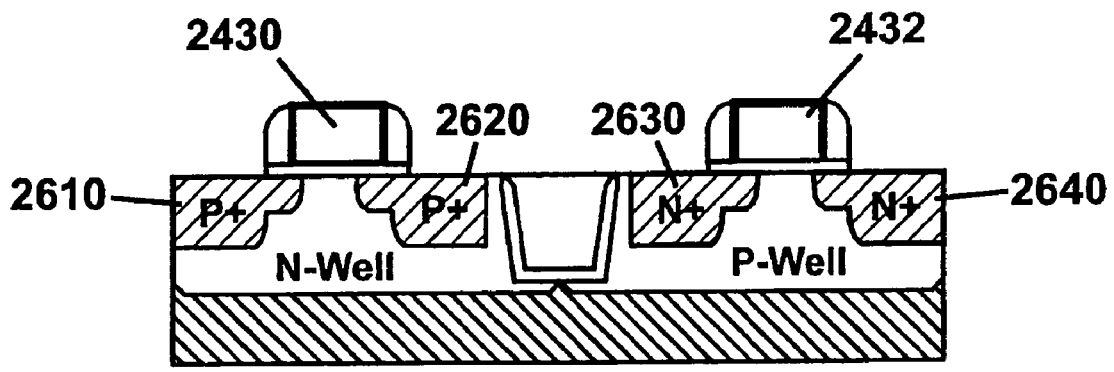
FIG. 6 shows a simplified method for forming heavily doped source region and heavily doped drain region for making split dual gate field effect transistor according to an embodiment of the present invention.

At the process 2130, one or more heavily doped source regions and one or more heavily doped drain regions are formed. FIG. 6 shows a simplified method for forming heavily doped source region and heavily doped drain region for making split dual gate field effect transistor according to an embodiment of the present invention. This diagram is merely an example, which should not unduly limit the scope of the claims. One of ordinary skill in the art would recognize many variations, alternatives, and modifications.

As shown in FIG. 6, one or more ion implantation processes are performed to form one or more heavily doped source regions and heavily doped drain regions. For example, the formed regions 2610 and 2620 are doped to p+ for PMOS. In another example, the formed regions 2630 and 2640 are doped to n+ for NMOS.

In one embodiment, the following processes are performed:

N+S/D Photo Mask
    Overlay (N+/AA=±0.12 μm)
    N+ S/D Implant: 1. specie $As^+$, energy 60 KeV, dosage $5.5\times10^{15}$ ions/cm$^2$, tilt 0; 2. specie $P^+$, energy 35 KeV, dosage $1.5\times10^{14}$ ions/cm$^2$, tilt 0
N+ S/D RTA anneal (1025° C., 20 seconds, $N_2$)
P+ S/D Photo Mask
    Overlay (P+/AA=±0.12 μm)
    P+ S/D Implant: 1. specie $B^+$, energy 5 KeV, dosage $3.5\times10^{13}$ ions/cm$^2$, tilt 0; 2. specie $B^+$, energy 15 KeV, dosage $3.0\times10^{13}$ ions/cm$^2$, tilt 0

Figure 7:
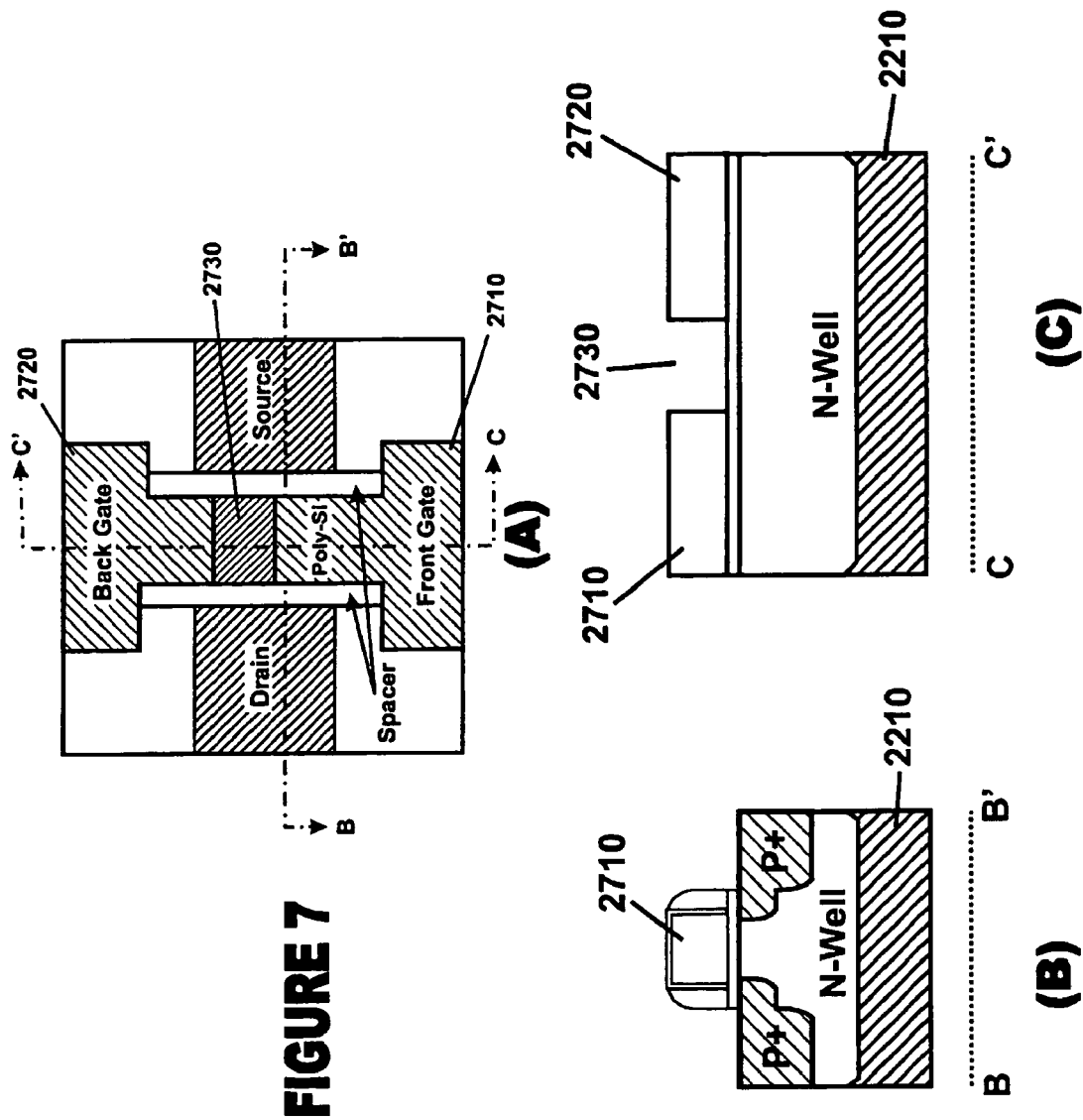
FIGS. 7(A), (B), and (C) show a simplified method for forming split dual gates for making split dual gate field effect transistor according to an embodiment of the present invention.

At the process 2135, split dual gates are formed. FIGS. 7(A), (B), and (C) show a simplified method for forming split dual gates for making split dual gate field effect transistor according to an embodiment of the present invention. FIG. 7(B) is a simplified cross-section along B and B', and FIG. 7(C) is a simplified cross-section along C and C'. These diagrams are merely examples, which should not unduly limit the scope of the claims. One of ordinary skill in the art would recognize many variations, alternatives, and modifications.

As shown in FIGS. 7(A), (B), and (C), part of the polysilicon gate region 2430 is removed. As a result, dual gate regions 2710 and 2720 are formed. Additionally, the dual gate regions 2710 and 2720 are separated by a gap 2730, such an air gap. In another example, similar dual gate regions are formed by removing part of the polysilicon gate region 2432.

In one embodiment, the following processes are performed:

PSDG POLY PHOTO (DUV scanner, Overlay (PSDG/AA=±0.07 μm))
PSDG Poly Gate Etch: 1. Hard bake; 2. Poly etch; 3. polymer dip (100:1 HF 10 seconds); 4. PR strip; 5. AEI.

In another embodiment, the following processes are performed to form the dual gate regions 2710 and 2720:

Polysilicon photolithography. For example: DUV scanner, 0.3±0.015 μm; Overlay (Poly Gate/AA=±0.07 μm).
Polysilicon etching. For example: 1. Hard bake; 2. Poly etch; 3. polymer dip (100:1 HF 10 seconds); 4. PR strip; 5. AEI/CD (0.3±0.015 μm); 6. Measure Oxide thickness on Active Area (>10 Å)

Figure 8:
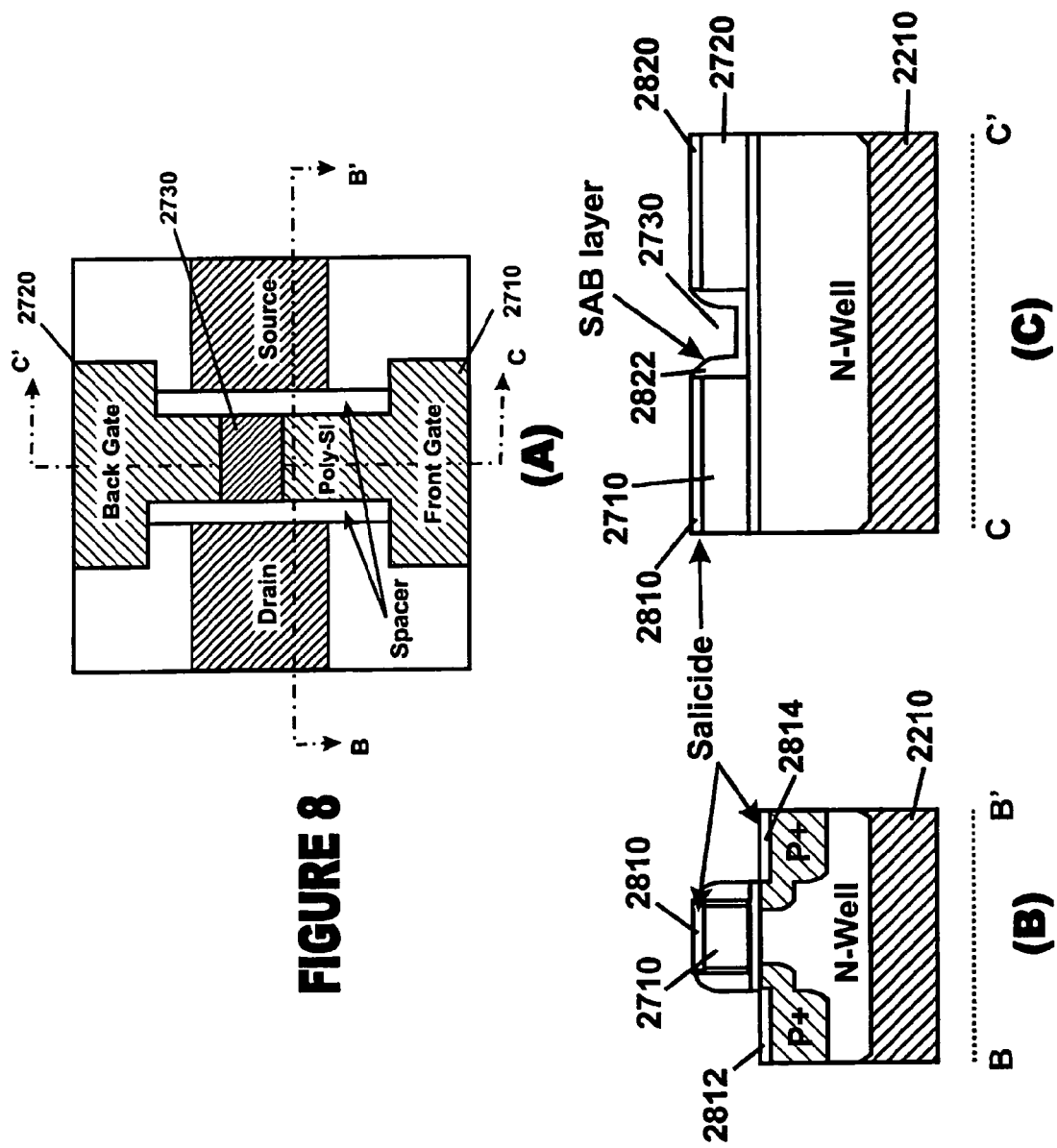
FIGS. 8(A), (B), and (C) show a simplified method for forming salicide layer and insulation layer for making split dual gate field effect transistor according to an embodiment of the present invention.

At the process 2140, one or more salicide layers are formed. FIGS. 8(A), (B), and (C) show a simplified method for forming salicide layer and insulation layer for making split dual gate field effect transistor according to an embodiment of the present invention. FIG. 8(B) is a simplified cross-section along B and B', and FIG. 8(C) is a simplified cross-section along C and C'. These diagrams are merely examples, which should not unduly limit the scope of the claims. One of ordinary skill in the art would recognize many variations, alternatives, and modifications.

As shown in FIGS. 8(A), (B), and (C), salicide layers 2810 and 2820 are formed on the dual gate regions 2710 and 2720. Additionally, at least salicide layers 2812 and 2814 are formed on the wafer 2210. Additionally, within the gap 2730, an insulation layer 2822 is formed. For example, the insulation layer 2822 includes a salicide block layer (SAB), such as an silicon-rich oxide layer. In another example, the insulation layer 2822 includes an insulation material, such as silicon oxide, silicon nitride, and/or silicon oxynitride. In yet another example, the insulation layer 2822 and the remaining part of the gap 2730 form an insulation region that separates the dual gate regions 2710 and 2720. In yet another example, similar salicide layers and insulation layer are formed for dual gate regions made from the polysilicon gate region 2432.

In one embodiment, the following processes are performed:

Salicide Block OXIDE DEPOSITION (SiON 350 Å)
S/D RTA Anneal (1015° C., 10 seconds, $N_2$)
SAB PHOTO (OVERLAY to AA, SAB/AA=±0.07 μm)
SAB ETCH (Dry and Wet NDH110A)
Co_Wet Pre_Clean (Wet NDH25A: Chemical 49% HF: $H_2O$ (1:100), temperature 22.5° C. ~23.5° C., 60 seconds)
Salicide Co DEPOSITION (Pre-clean RF 150 W and remove oxide 30 Å, deposition Cobalt 85 Å)
Salicide TiN DEPOSITION (Cap 200 Å)
RTA1/Selective
Wet Etch/RTA2 (RTA1: 500° C.; RTA2: 850° C.)

In another embodiment, to form the insulation layer 2822, a photolithography is performed to pattern the SAB layer. The SAB photo mask is aligned to Active Area (AA) layer mark, for example, OVERLAY SAB/AA=±0.07 μm. After the photolithography, the SAB layer is etched by plasmas dry etch and then wet etch. For example, the wet etch process uses the chemical 49% HF: $H_2O$ (1:100) solvent at the temperature of 22.5° C.~23.5° C. for 270 seconds.

Figure 9:
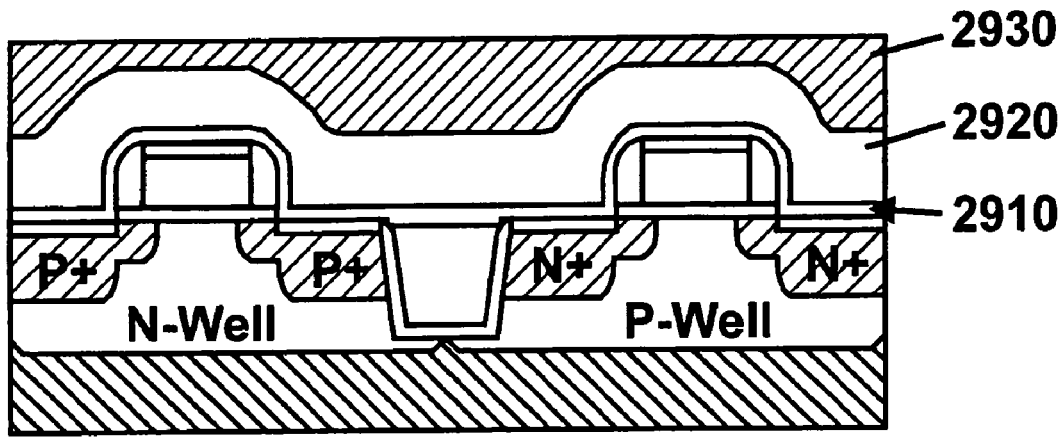
FIG. 9 shows a simplified method for forming inter-layer dielectric layer for making split dual gate field effect transistor according to an embodiment of the present invention.

At the process 2145, one or more inter-layer dielectric layer is formed. FIG. 9 shows a simplified method for forming inter-layer dielectric layer for making split dual gate field effect transistor according to an embodiment of the present invention. This diagram is merely an example, which should not unduly limit the scope of the claims. One of ordinary skill in the art would recognize many variations, alternatives, and modifications.

As shown in FIG. 9, a silicon oxynitride layer 2910 is formed to cover at least part of the structure that results from the process 2140. Additionally, a BPSG layer 2920 is deposited on the silicon oxynitride layer 2910 and undergoes a reflow process. On the BPSG layer 2920, an oxide layer 2930 is formed and planarized by a CMP process.

In one embodiment, the following processes are performed:

PE-SION DEPOSITION (400 Å ETCH Stop Layer)
Scrubber Clean
BPSG DEPOSITION/Reflow/CR Clean (2K/0650BPF30M)
PETEOS DEPOSITION (10.5 KÅ)
Oxide CMP for ILD (Post CMP THICKNESS 7.5 KÅ±1KÅ)

Figure 10:
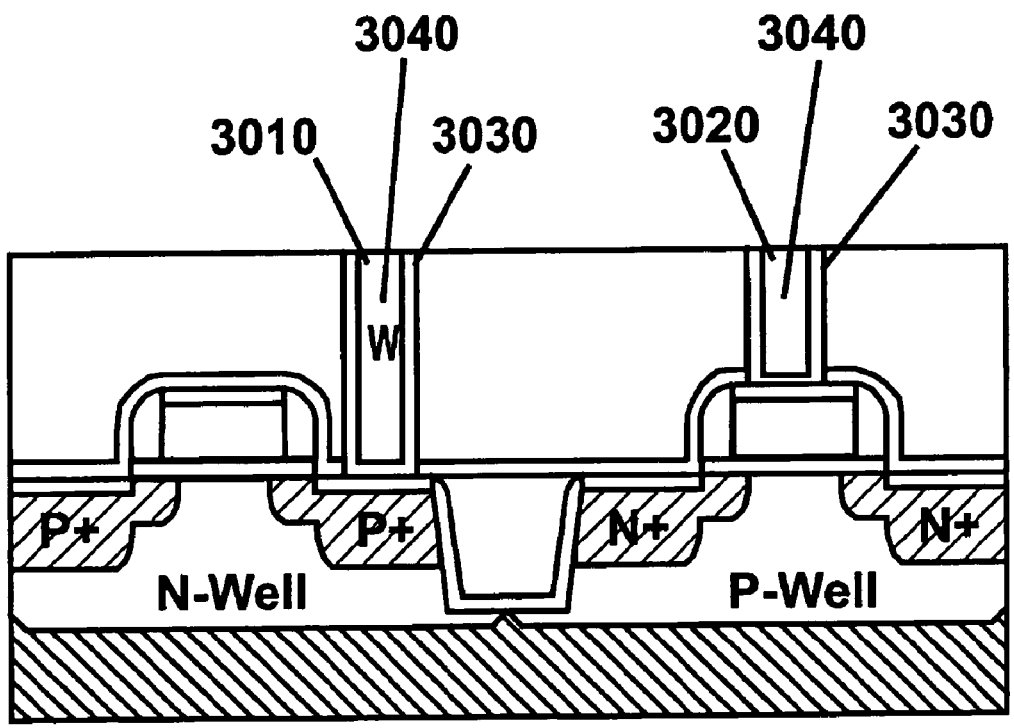
FIG. 10 shows a simplified method for forming contact layer for making split dual gate field effect transistor according to an embodiment of the present invention.

At the process 2150, one or more contact layers are formed. FIG. 10 shows a simplified method for forming contact layer for making split dual gate field effect transistor according to an embodiment of the present invention. This diagram is merely an example, which should not unduly limit the scope of the claims. One of ordinary skill in the art would recognize many variations, alternatives, and modifications.

As shown in FIG. 10, one or more contact holes are formed. For example, contact holes 3010 and 3020 expose the salicide layer 2814 and the salicide layer on the polysilicon gate region 2432. In one embodiment, the polysilicon gate region 2432 is etched to become dual gate regions at the process 2135. In another embodiment, the polysilicon gate region 2432 is not etched to become dual gate regions at the process 2135. In the contact holes, a layer 3030 is formed to cover the bottom surfaces and side surfaces. For example, the layer 3030 includes Ti and TiN. Afterwards, the contact holes are filled by tungsten material 3040.

In one embodiment, the following processes are performed:
CONTACT_PHOTO DARC (Oxide 200 Å and SiON 600 Å)
CONTACT PHOTO (OVERLAY/CD: ±0.045 µm, 0.235 µm)
CONTACT ETCH (0.235 µm)
CONTACT Glue layer (Pre-clan 100 Å, Ti 200 Å, TiN 1×50 Å) Glue Anneal (0690RTA60S)
Tungsten Plug (W) DEPOSITION (W3.3 KÅ bulk deposition 415° C.)

Figure 11A:
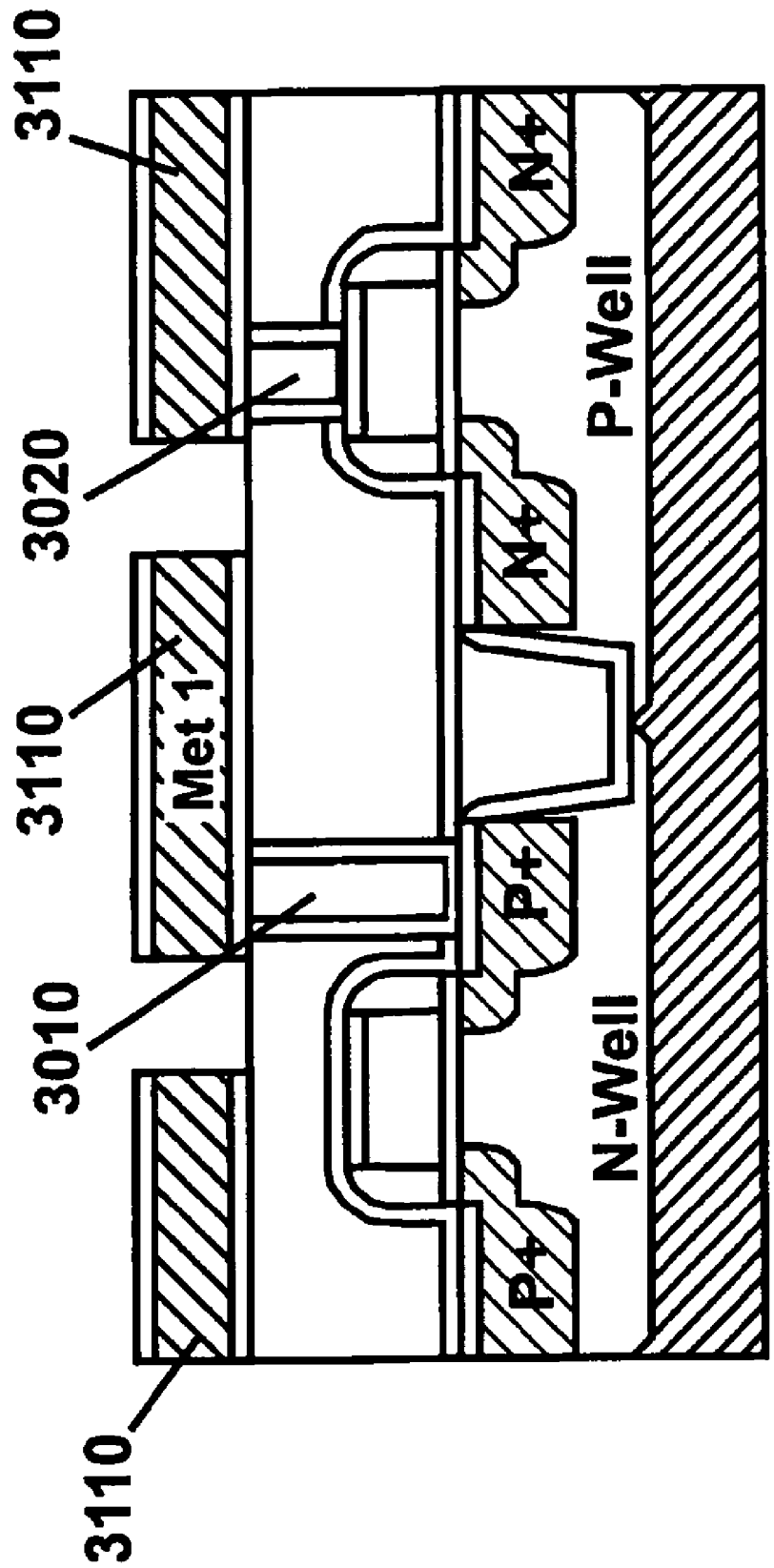
FIGS. 11(A) and (B) show a simplified method for forming metal layer for making split dual gate field effect transistor according to an embodiment of the present invention.

At the process 2155, one or more metal layers are formed. FIGS. 11(A) and (B) show a simplified method for forming metal layer for making split dual gate field effect transistor according to an embodiment of the present invention. These diagrams are merely examples, which should not unduly limit the scope of the claims. One of ordinary skill in the art would recognize many variations, alternatives, and modifications.

Figure 11B:
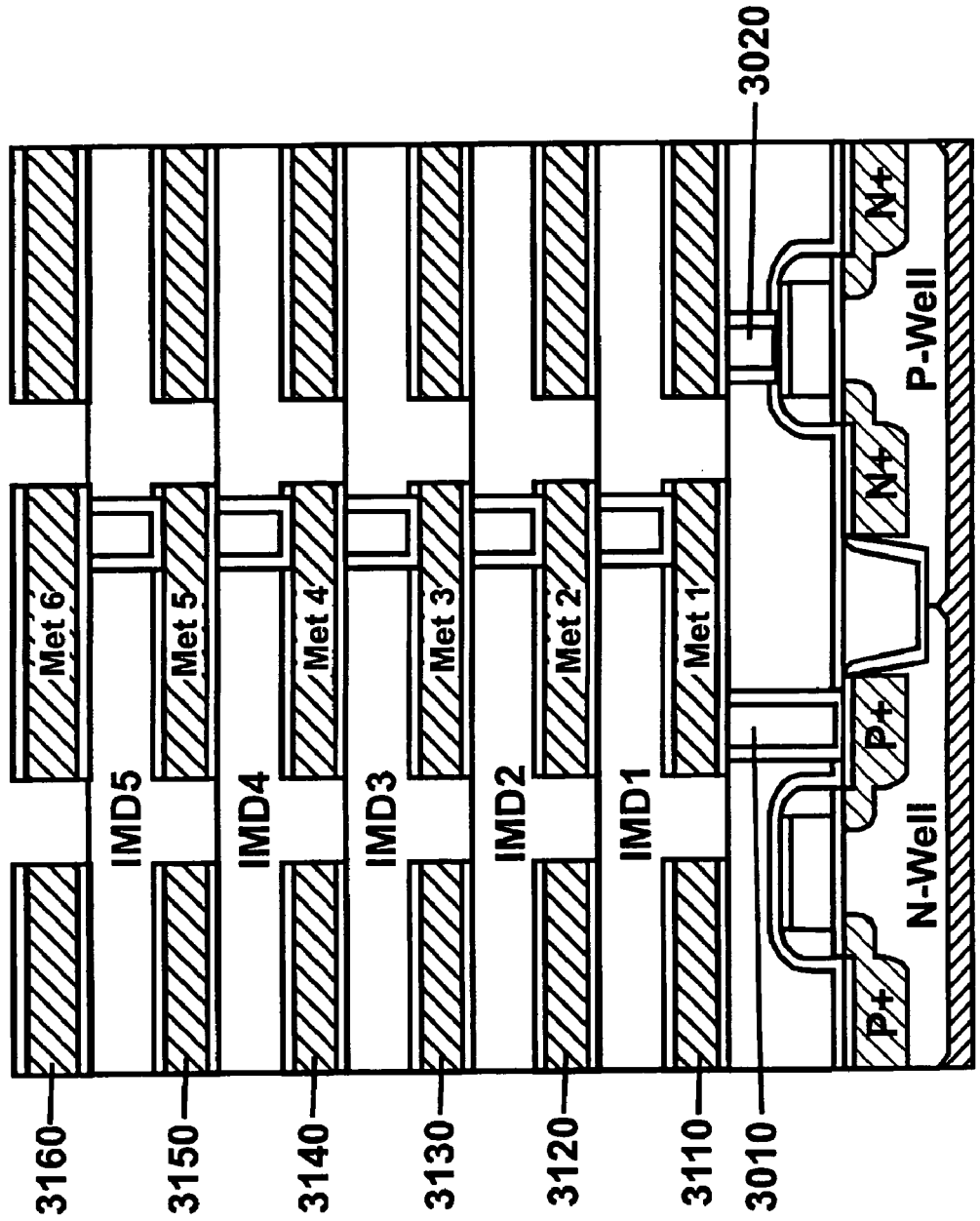

As shown in FIGS. 11 (A) and (B), one or more metal layers are formed. For example, a metal layer 3110 is in contact with the contact holes 3010 and 3020 filled with the tungsten material 3040. In another example, at least one of the additional metal layers 3120, 3130, 3140, 3150, and 3160 are also formed. The different metal layers are separated by at least an inter-metal dielectric layer. The inter-metal dielectric layer is punched through to form one or conductive plugs, which provide conductive connections between the metal layers.

In one embodiment, the following processes are performed to form a metal layer:
METAL1 Sputter (Ti/TiN/AlCu/Ti/TiN: THICKNESS 100 Å/200 Å/4KÅ/50 Å/300 Å) (for example, Ti for better TiO$_2$ adhesion; in another example, TiN to prevent TiAl$_3$)
Scrubber
METAL1_PHOTO DARC (320 Å SiON)
Scrubber
METAL1 PHOTO (0.22±0.015)
METAL1 ETCH (0.24±0.02)

In another embodiment, at least the following additional processes are performed to form additional metal layers:
IMD Linear OX DEPOSITION(SRO_500 Å)
IMD HDP FGS OX (SRO_100 Å and 6 KÅ)
IMD PEFSG OX (11.5 KÅ)
IMD CMP (Post THICKNESS 6.5 KÅ±1.2 KÅ)
USG DEPOSITION (2 KÅ)
VIA1~Top Via PHOTO (0.26 µm, 0.39 µm)
VIA1~Top Via ETCH (0.26 µm, 0.39 µm)
M2~TOP Metal PHOTO (0.26 µm, 0.49 µm)
M2~TOP Metal ETCH (0.28 µm, 0.51 µm)

Figure 12:
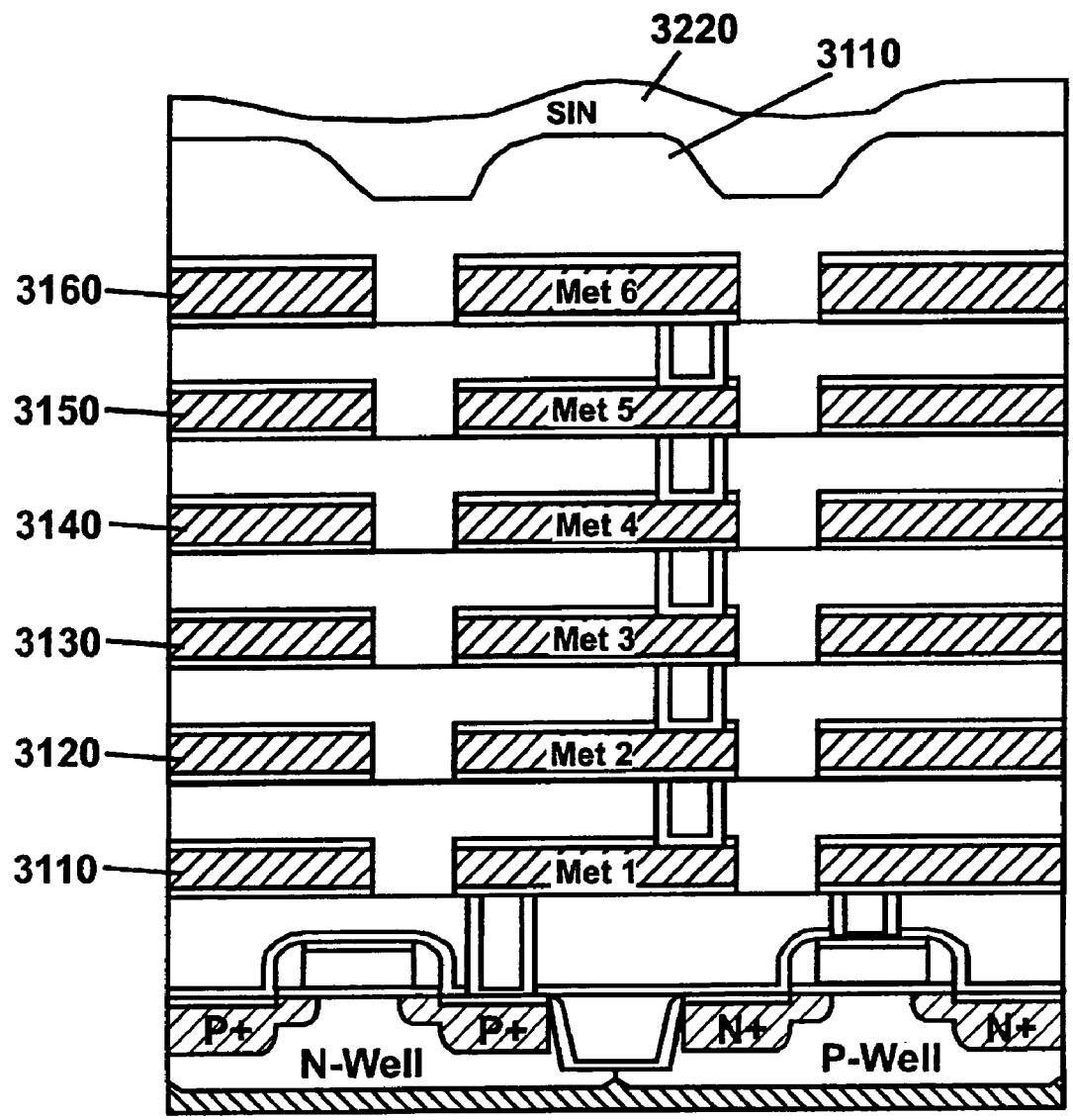
FIG. 12 shows a simplified method for forming passivation layer for making split dual gate field effect transistor according to an embodiment of the present invention.

At the process 2160, one or more passivation layers are formed. FIG. 12 shows a simplified method for forming passivation layer for making split dual gate field effect transistor according to an embodiment of the present invention. This diagram is merely an example, which should not unduly limit the scope of the claims. One of ordinary skill in the art would recognize many variations, alternatives, and modifications.

As shown in FIG. 12, one or more passivation layers are formed. For example, an oxide layer 3210 is formed on at least a metal layer, such as the metal layer 3160. In another example, a nitride layer 3220 is also formed on the oxide layer 3210.

In one embodiment, the following processes are performed to form a metal layer:
Passivation HDP Oxide DEPOSITION 10 KÅ
Passivation Nitride DEPOSITION 6 KÅ

FIGS. 13(A) and (B) show a simplified method for making split dual gate field effect transistor according to another embodiment of the present invention. This diagram is merely an example, which should not unduly limit the scope of the claims herein. The method 3300 includes some or all of the 168 processes. Although FIGS. 13(A) and (B) have been shown using a selected sequence of processes, there can be many alternatives, modifications, and variations. For example, some of the processes may be expanded and/or combined. Other processes may be inserted to those noted above. Depending upon the embodiment, the specific sequence of processes may be interchanged with others replaced. Some of the processes may be expanded and/or combined, and/or other processes may be inserted to those noted above.

According to yet another embodiment of the present invention, a method for making a semiconductor device with at least two gate regions includes providing a substrate region including a surface. Additionally, the method includes forming a source region in the substrate region by at least implanting a first plurality of ions into the substrate region and forming a drain region in the substrate region by at least implanting a second plurality of ions into the substrate region. The drain region and the source region are separate from each other. Moreover, the method includes depositing a gate layer on the surface and forming a first gate region and a second gate region on the surface. The forming a first gate region and a second gate region includes forming an insulation region on the surface by at least removing a part of the gate layer, and the first gate region and the second gate region are separated by the insulation region. The first gate region is capable of forming a first channel in the substrate region, and the first channel is from the source region to the drain region. The second gate region is capable of forming a second channel in the substrate region, and the second channel is from the source region to the drain region. For example, the method is implemented according to the method 2100 and/or the method 3300.

According to yet another embodiment of the present invention, a method for making a semiconductor device with at least two gate regions includes providing a substrate region including a surface. Additionally, the method includes forming a source region in the substrate region by at least implanting a first plurality of ions into the substrate region, and forming a drain region in the substrate region by at least implanting a second plurality of ions into the substrate region. The drain region and the source region are separate from each other. Moreover, the method includes depositing a gate layer on the surface and forming a first spacer region. The first spacer region is in contact with the gate layer. Also, the method includes forming a second spacer region, and the second spacer region is in contact with the gate layer. Additionally, the method includes removing at least a part of the gate layer to form a first gate region, a second gate region, and an insulation region on the surface. The first gate region and the second gate region are separated by the insulation region. For example, the method is implemented according to the method 2100 and/or the method 3300.

According to yet another embodiment of the present invention, a method for making a semiconductor device with at least two gate regions includes providing a substrate region including a surface. Additionally, the method includes forming a source region in the substrate region by at least implanting a first plurality of ions into the substrate region, and forming a drain region in the substrate region by at least implanting a second plurality of ions into the substrate region. The drain region and the source region are separate from each other. Moreover, the method includes depositing a gate layer on the surface, and forming a first spacer region. The first spacer region is in contact with the gate layer. Also, the method includes forming a second spacer region, and the second spacer region is in contact with the gate layer. Additionally, the method includes removing at least a part of the gate layer to form a first gate region, a second gate region, and an insulation region on the surface. The first gate region and the second gate region are separated by the insulation region. The first gate region is associated with a first channel related to a first channel length, and the first channel length is equal to or shorter than 200 nm. The insulation region is associated with a width in a direction from the first gate region to the second gate region, and the width ranges from 10 nm to 10,000 nm. For example, the method is implemented according to the method 2100 and/or the method 3300.

Figure 14:
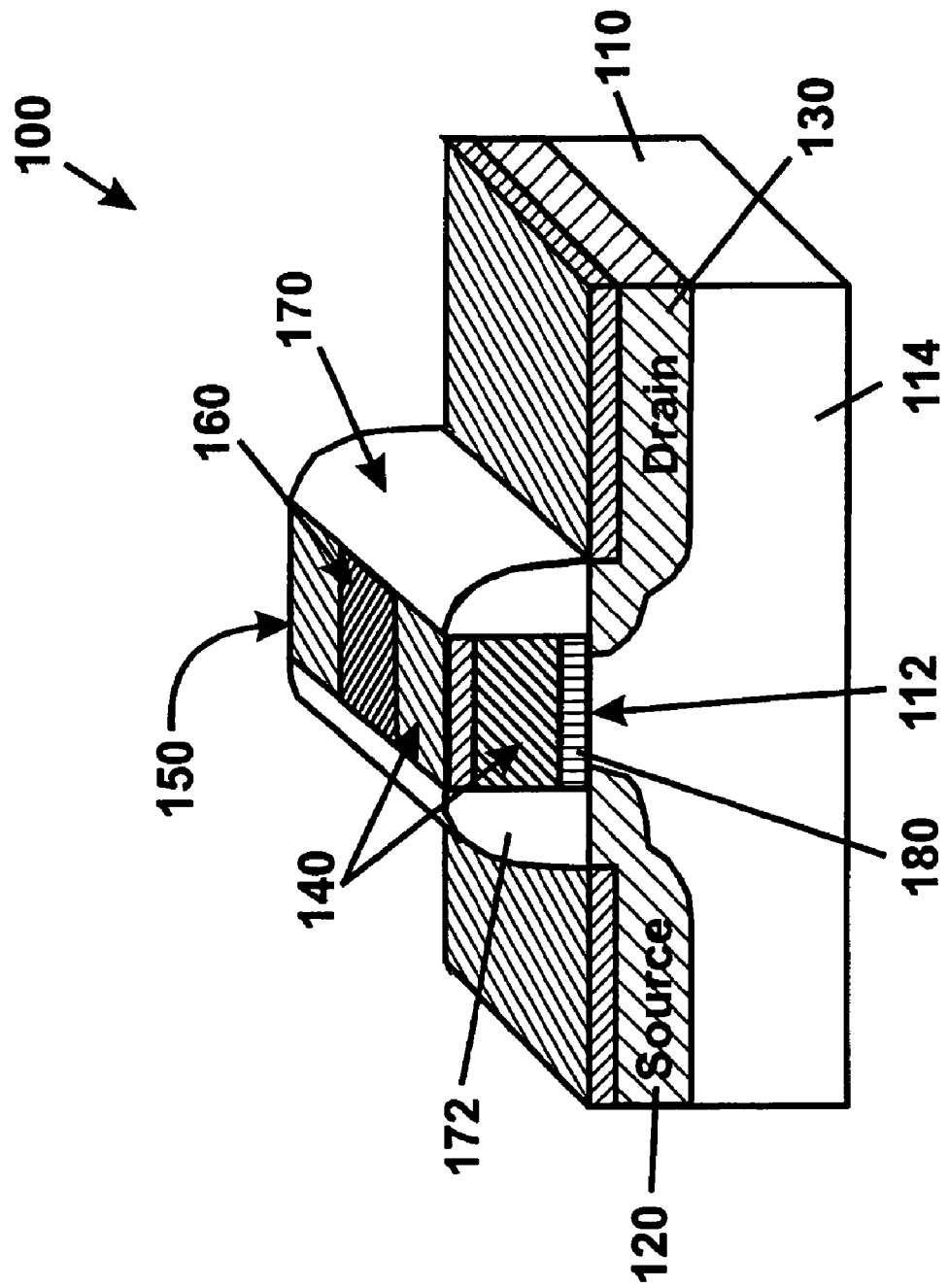
FIG. 14 is a simplified diagram for split dual gate field effect transistor according to an embodiment of the present invention.

FIG. 14 is a simplified diagram for split dual gate field effect transistor according to an embodiment of the present invention. This diagram is merely an example, which should not unduly limit the scope of the claims. One of ordinary skill in the art would recognize many variations, alternatives, and modifications. For example, the device 100 is made according to the method 2100. In another example, the device 100 is made according to the method 3300. The device 100 includes the following components:

1. Substrate region 110;
2. Source region 120;
3. Drain region 130;
4. Gate regions 140 and 150;
5. Insulation region 160;
6. Spacer regions 170 and 172;
7. Gate dielectric region 180.

Although the above has been shown using a selected group of components for the device 100, there can be many alternatives, modifications, and variations. For example, some of the components may be expanded and/or combined. Other components may be inserted to those noted above. Depending upon the embodiment, the arrangement of components may be interchanged with others replaced. For example, the device 100 is an NMOS transistor. In another example, the device 100 is a PMOS transistor. Further details of these components are found throughout the present specification and more particularly below.

In one embodiment, the substrate region 110 is made of a semiconductor material. For example, the semiconductor material is silicon. The semiconductor substrate region 110 is intrinsic or doped to p-type or n-type. For example, the substrate region 110 is doped to p-type, with a dopant concentration ranging from $1.0 \times 10^{15}$ cm$^{-3}$ to $2.0 \times 10^{15}$ cm$^{-3}$. In another example, the substrate region 110 is doped to n-type, with a dopant concentration ranging from $1.0 \times 10^{15}$ cm$^{-3}$ to $2.0 \times 10^{15}$ cm$^{-3}$.

The source region 120 and the drain region 130 are doped to n-type or p-type. For example, the source region 120 is doped to n-type with a dopant concentration ranging from $1.0 \times 10^{18}$ cm$^{-3}$ to $1.0 \times 10^{19}$ cm$^{-3}$, and the drain region 130 is doped to n-type with a dopant concentration ranging from $1.0 \times 10^{18}$ cm$^{-3}$ to $1.0 \times 10^{19}$ cm$^{-3}$. In another example, the source region 120 is doped to p-type with a dopant concentration ranging from $1.0 \times 10^{18}$ cm$^{-3}$ to $1.0 \times 10^{19}$ cm$^{-3}$, and the drain region 130 is doped to p-type with a dopant concentration ranging from $1.0 \times 10^{18}$ cm$^{-3}$ to $1.0 \times 10^{19}$ cm$^{-3}$.

The gate dielectric region 180 is located on the top surface 112 of the substrate region 110. For example, the gate dielectric region 180 is made of silicon oxide, silicon nitride, silicon oxynitride, or any combination thereof. In another example, the gate dielectric region is a dielectric layer. The gate regions 140 and 150 and the insulation region 160 are located on the gate dielectric region 180. For example, the gate regions 140 and 150 each are made of polysilicon. As shown in FIG. 14, the gate regions 140 and 150 are not in direct contact with each other but are separated by the insulation region 160. For example, the insulation region 160 has two side surfaces, one of which is in direct contact with the gate region 140 and the other one of which is in direct contact with the gate region 150. In another example, the insulation region 160 includes a gap, such as an air gap. In yet another example, the insulation region 160 includes silicon oxide, silicon nitride, silicon oxynitride, or any combination thereof. In yet another example, the insulation region 160 includes SAB.

The spacer regions 170 and 172 are located on the top surface 112. The spacer region 170 is in direct contact with the gate regions 140 and 150 and the insulation region 160 on one side, and the spacer region 172 is in direct contact with the gate regions 140 and 150 and the insulation region 160 on another side. For example, the spacer regions 170 and 172 each are made of silicon oxide, silicon nitride, silicon oxynitride, or any combination thereof.

Figure 15:
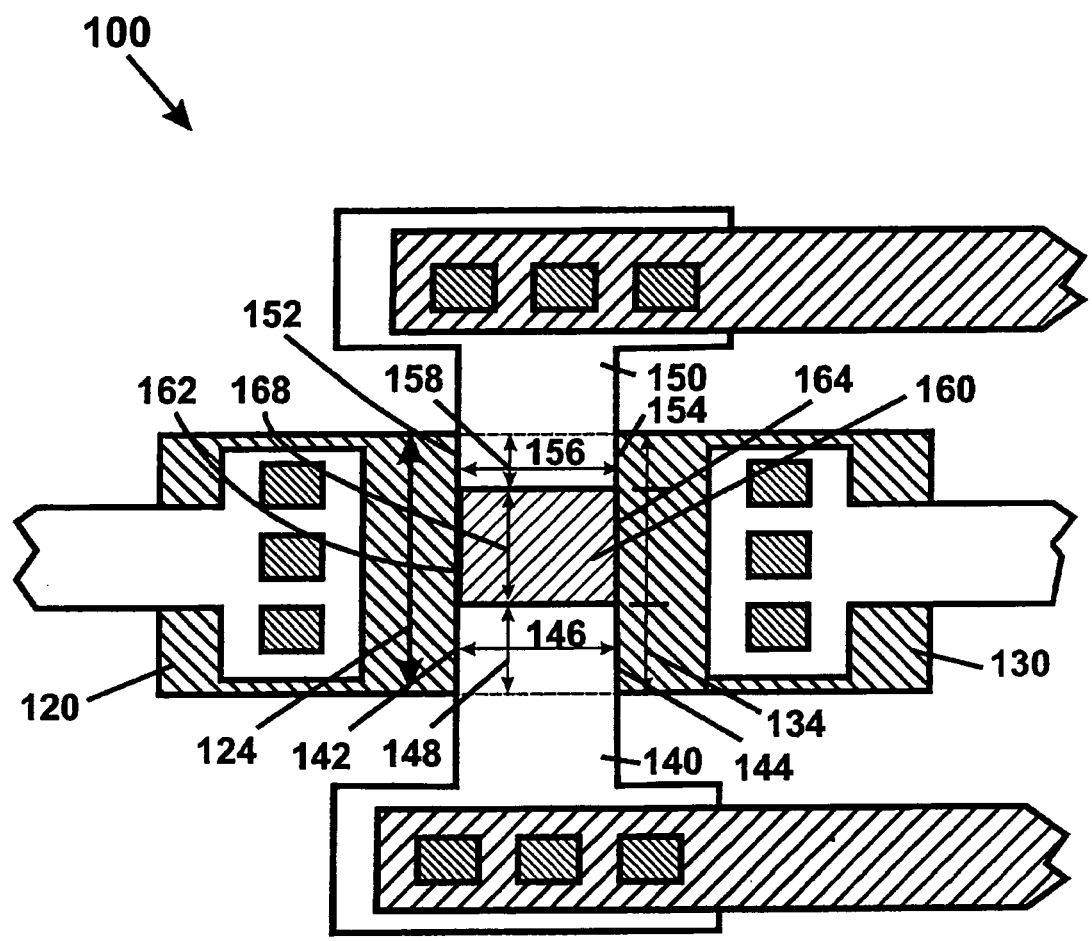
FIG. 15 is a simplified top-view layout diagram for split dual gate field effect transistor according to another embodiment of the present invention.

FIG. 15 is a simplified top-view layout diagram for split dual gate field effect transistor according to another embodiment of the present invention. This diagram is merely an example, which should not unduly limit the scope of the claims. One of ordinary skill in the art would recognize many variations, alternatives, and modifications. The device 100 includes at least the source region 120, the drain region 130, the gate regions 140 and 150, and the insulation region 160. Although the above has been shown using a selected group of components for the device 100, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

As shown in FIG. 15, the gate regions 140 and 150 are separated by the insulation region 160. The gate regions 140 and 150 and the insulation region 160 form a continuous region, and the continuous region separates the source region 120 and the drain region 130 in the top view. The gate region 140 includes side surfaces 142 and 144, the gate region 150 includes side surfaces 152 and 154, and the insulation region 160 includes side surfaces 162 and 164. For example, the side surfaces 142, 152, and 162 form a continuous surface, and the side surfaces 144, 154, and 164 form another continuous surface. In another example, the source region 120 is aligned with the side surfaces 142, 152, and 162. In yet another example, the drain region 130 is aligned with the side surfaces 144, 154, and 164.

The source region 120 has a width 124, and the drain region 130 has a width 134. For example, the width 124 ranges from 10 nm to 20,000 nm. In another example, the width 134 ranges from 10 nm to 10,000 nm. In one embodiment, the widths 124 and 134 are the same. In another embodiment, the widths 124 and 134 are different. The gate region 140 has a length 146, and the gate region 150 has a length 156. For example, the length 146 ranges from 10 nm to 1,000 nm. In another example, the length 156 ranges from 10 nm to 1,000 nm. In one embodiment, the lengths 146 and 156 are the same. In another embodiment, the lengths 146 and 156 are different. The gate region 140 has a width 148, the gate region 150 has a width 158, and the insulation region 160 has a width 168. For example, the total width for the width 148, the width 158, and the width 168 is equal to the width 124 and/or the width 134. In another example, the width 148 ranges from 10 nm to 15,000 nm. In yet another example, the width 158 ranges from 10 nm to 15,000 nm. In yet another example, the width 168 ranges from 10 nm to 15,000 nm. In yet another example, the width 168 ranges from 10 nm to 10,000 nm. In one embodiment, the widths 148 and 158 are the same. In another embodiment, the widths 148 and 158 are different.

As shown in FIGS. 14 and 15, the gate regions 140 and 150 are physically separated by the insulation region 160 according to an embodiment of the present invention. For example, the gate regions 140 and 150 can be biased to different voltage levels. In another embodiment, the gate region 140 with proper bias can form a channel from the source region 120 to the drain region 130 in the substrate region 110, and the gate region 150 with proper bias can form another channel from the source region 120 to the drain region 130 in the substrate region 110. For example, the channel under the gate region 140 has a length 146, and the channel under the gate region 150 has a length 156.

The present invention has various advantages. Some embodiments of the present invention provide a new method for making a new planar split dual gate transistor device. Certain embodiments of the present invention provide a method for making dual gates that can be biased independently. For example, the independent gate biases can provide dynamical control of the device characteristics such as threshold voltage, sub-threshold swing, and/or the saturation drain current. Some embodiments of the present invention can be used to make a device that significantly reduces transistor leakage current. Certain embodiments of the present invention provide a method for making a device that has adjustable threshold voltage without varying gate oxide thickness or doping profile.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for making a semiconductor device with at least two gate regions, the method comprising:
   providing a substrate region including a surface;
   forming a gate dielectric layer on the surface;
   depositing a gate layer on the gate dielectric layer;
   patterning the gate layer to form a gate electrode region;
   forming spacer regions on the sides of the gate electrode region;
   forming a source region and a drain region in the substrate region on either side of the gate electrode region, respectively;
   removing at least a part of the gate electrode region to form a first gate region, a second gate region, and a gap region between the source region and the drain region, the gap region being between the first gate region and the second gate region;
   depositing an insulation material in the gap region to form an insulation region;
   wherein:
      a first channel region and a second channel region are formed between the source region and the drain region;
      the first channel region is under the first gate region; and
      the second channel region is under the second gate region.

2. A method for making a semiconductor device with at least two gate regions, the method comprising:
   providing a substrate region including a surface;
   forming a gate dielectric layer on the surface;
   depositing a gate layer on the gate dielectric layer;
   patterning the gate layer to form a gate electrode region;
   forming spacer regions on the sides of the gate electrode region;
   forming a source region and a drain region in the substrate region on either side of the gate electrode region, respectively;
   removing at least a part of the gate electrode region to form a first gate region, a second gate region, and a gap region between the source region and the drain region, the gap region being between the first gate region and the second gate region;
   depositing an insulation material in the gap region to form an insulation region;
   wherein:
      a first channel region and a second channel region are formed between the source region and the drain region;
      the first channel region is under the first gate region;
      the second channel region is under the second gate region;
   wherein:
      the first channel length being equal to or shorter than 200 nm;
      the insulation region is associated with a width in a direction from the first gate region to the second gate region, the width ranging from 10 nm to 10,000 nm.

3. The method of claim 2 wherein:
   the first channel and the second channel are not in contact with each other.

* * * * *